(12) United States Patent
Singh et al.

(10) Patent No.: US 6,259,838 B1
(45) Date of Patent: Jul. 10, 2001

(54) LINEARLY-ADDRESSED LIGHT-EMITTING FIBER, AND FLAT PANEL DISPLAY EMPLOYING SAME

(75) Inventors: Bawa Singh, Voorhees; William Ronald Roach, Rocky Hill; Satyam Choudary Cherukuri, Princeton; Peter John Zanzucchi, Lawrenceville; Israel Kalish, West Orange; James Harold Atherton, Ringoes, all of NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/419,166

(22) Filed: Oct. 15, 1999

Related U.S. Application Data

(60) Provisional application No. 60/104,442, filed on Oct. 16, 1998, provisional application No. 60/118,430, filed on Feb. 2, 1999, and provisional application No. 60/121,258, filed on Feb. 23, 1999.

(51) Int. Cl.$^7$ ...................................................... G02B 6/26

(52) U.S. Cl. ............................ 385/31; 385/131; 385/901

(58) Field of Search .............................. 385/31, 1, 9, 18, 385/27, 47, 123, 131, 901

(56) References Cited

U.S. PATENT DOCUMENTS

| | | |
|---|---|---|
| 3,701,924 | 10/1972 | Glaser . |
| 4,782,336 | 11/1988 | Bailey . |
| 4,952,031 | 8/1990 | Tsunoda et al. . |
| 5,106,181 | * 4/1992 | Rockwell, III ...................... 385/1 X |
| 5,170,448 | 12/1992 | Ackley et al. . |
| 5,300,862 | 4/1994 | Parker et al. . |
| 5,596,671 | 1/1997 | Rockwell, III . |
| 5,767,824 | 6/1998 | Jacobsen . |

OTHER PUBLICATIONS

Gu G et al: "Design of Flat–Panel Displays Based on Organic Light–Emitting Devices" IEEE Journal of Selected Topics in Quantum Electronics, US, IEEE, Service Center, vol. 4, No. 1, Jan. 1, 1998, pp. 83–99, XP000766108 ISSN: 1077–260X Section III, Addressing Schemes for Monocromatic Displays Section IV: Full–Color Displays figure I.

International Search Report.

"Flexible, Fiber–Based Large–Area, Flat Pane Display Technology", Technical and Management Proposal #99= 13000–1–095, vol. 1, Mar. 26, 1999 (Business and Financial Data Redacted).

(List continued on next page.)

*Primary Examiner*—Phan T. H. Palmer
(74) *Attorney, Agent, or Firm*—William J. Burke

(57) ABSTRACT

A display as for images and/or information comprises a plurality of linearly addressed light-emitting fibers disposed in side-by-side arrangement to define a viewing surface. Each light-emitting fiber includes a plurality of light-emitting elements disposed along its length which is linearly addressed by signals provided by a drive circuit at one end thereof. Linear addressing signals are either optical signals or electrical signals, and may be frequency modulated, digitally encoded or analog encoded. A detector associated with each pixel detects the linear addressing signal and decodes same to activate and deactivate organic or inorganic light-emitting material elements. Thus, the light-emitting elements emit light to display a pixel or sub-pixel of the image and/or information. The light-emitting fiber may include a transparent fiber as substrate for propagating the optical signals therethrough and may include electrical conductors disposed along its length for propagating the electrical signals.

26 Claims, 7 Drawing Sheets

OTHER PUBLICATIONS

Fred Weissortel, et al. "Spiros, Spiro–Spiros and Other Novel Amorphous Materials for Blue Electroluminescence", Extended Abstracts, The Fourth International Conference on the Science and Technology of Display Phosphors, Sep. 14–17, 1998.

D.F. O'Brien et al., Efficient Saturated Red Emission From a Phosphorescent Doped Organic Light Emitting Device, Extended Abstracts, The Fourth International Conference on the Science and Technology of Display Phosphors, Sep. 14–17, 1998.

E.W. Forsythe et al., Interface Analysis of Naththyl–Substituted Benzidine Derivative and Tris–8–(Hydroxyquinoline) Aluminum Using Ultraviolet and X–Ray Photoemission Spectroscopy, Extended Abstracts, The Fourth International Conference on the Science and Technology of Display Phosphors, Sep. 14–17, 1998.

Y. Sato et al., Red Emitting Organic El Devices with Novel Dopants, Extended Abstracts, The Fourth International Conference on the Science and Technology of Display Phosphors, Sep. 14–17, 1998.

SID (Society for Information Display International Symposium Digest of Technical Papers) vol. XXX, May 18–20, 1999, Invited paper: "Organic LED Full–Color Passive–Matrix Display". Y. Fukuda et al., pp 430–433.

J.H. Burroughes, High Efficiency Polymer Light Emitting Diodes, Extended Abstracts, The Fourth International Conference on the Science and Technology of Display Phosphors, Sep. 14–17, 1998.

* cited by examiner

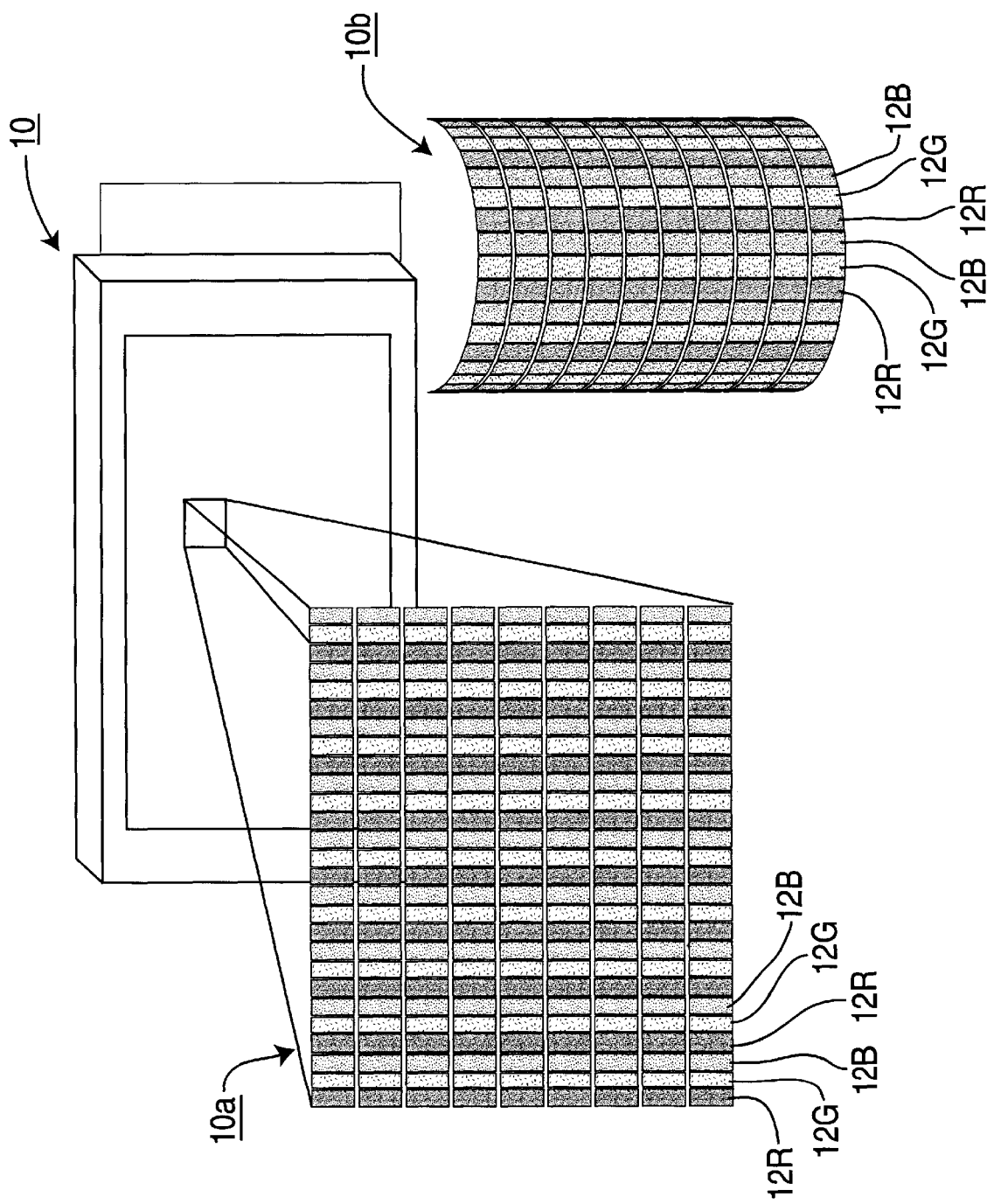

LINEARLY-ADDRESSED LIGHT-EMITTING FIBER, AND FLAT PANEL DISPLAY EMPLOYING SAME

This Application claims the benefit of U.S. Provisional Application Ser. No. 60/104,442 filed Oct. 16, 1998, of U.S. Provisional Application Ser. No. 60/118,430 filed Feb. 2, 1999, and of U.S. Provisional Application Ser. No. 60/121,258 filed Feb. 23, 1999.

The present invention relates to a display and, in particular, to a light emitting fiber as for a display.

The desire for large-size display screens has exceeded the limits of conventional cathode ray tube (CRT) technology in which both the weight and depth of a display tube become excessive when the diagonal of the screen size exceeds about 90 to 100 cm (about 36 to 40 inches). Alternatives in both rear projection and front projection displays have, at least temporarily, filled a need for larger screen displays in the range of about 90 to 150 cm (about 36 to 60 inches) diagonal, however, such projection displays are also quite deep to accommodate the projection optics, behind the screen in a rear projection display and in the projector in a front projection display, and also have difficulty in achieving and maintaining suitable optical alignment and image registration.

Moreover, as other technologies such as plasma displays and active matrix liquid crystal displays (AMLCD) have been considered for application to large size screen displays that are relatively thin, production yield and cost have become a significant problem. This problem arises from the fact that as the diagonal dimension of the display screen increases, the number of picture elements or pixels in the display increases as the square of the dimension increase, i.e. in relation to the area, and so increases the probability of any display having a defective pixel. Thus a 20% increase in screen diagonal results in about a 44% increase in the screen area and thus in the number of pixel elements and, disregarding the increased difficulty of manufacturing a larger structure, the likelihood of a defective pixel also increases by about 44%. For example, a process having a 90% yield in producing 50 cm (about 20 inch) diagonal displays would have about a 40% yield for 125-cm (about-50 inch) diagonal displays, and about a 10% yield for 150-cm (about 60-inch) diagonal displays.

Displays with defective pixels are generally not repairable and so must be discarded—any one visible defect can be enough to cause the entire display panel to be scraped, and the defect can only be found after the expensive panel processing is completed, thereby creating expensive waste. In addition, the capital cost of processing facilities capable of producing such large-area displays is very high, as is the per unit processing cost owing to the need for precision processing, such as lithography, for example. These are major disadvantages of these technologies.

A further disadvantage of the foregoing conventional technologies is that each display device size and configuration must be specifically designed and must be specially tooled for manufacture, both of which require substantial time and resources to accomplish. It would be desirable to avoid such specialized designs.

In addition, where the display screen size is greater than that which can be realized with a single structure in a conventional display technology, as is the case, for example, with wall-size displays, very-large screen television displays, billboards, scoreboards, highway and other signs and the like, it becomes necessary to array (or "tile") a number of display sections side-by-side to together form a larger display screen, thereby introducing seams between the tiled sections that produce objectionable lines or distortions in the displayed composite image.

Accordingly, there is a need for a display device that is suitable for large-size displays and that is not excessively deep or heavy. It would also be desirable that such display not require tiling to form large display screens and that the defect rate not increase as the square of a screen dimension increase.

To this end, the light-emitting fiber of the present invention comprises an elongated fiber substrate, at least one electrical conductor disposed along the fiber substrate for conducting an electrical signal along the fiber substrate, and a plurality of light-emitting elements disposed along a surface of the fiber substrate, each light-emitting element having first and second electrodes between which the electrical signal is applied to cause the light-emitting element to emit light. Means operably associated with the fiber substrate propagates an information-representative signal along the fiber substrate, and a plurality of detectors are disposed along the fiber substrate, each operably associated with one of the plurality of light-emitting elements for selectively applying the electrical signal thereto in response to the information-representative signal propagating along the fiber substrate.

According to a further aspect of the invention, a display for displaying information comprises a plurality of fibers disposed in side-by-side arrangement to define a viewing surface of the display, at least one electrical conductor disposed along each of the plurality of fibers for conducting an electrical signal along each of the fibers, and a plurality of light-emitting elements disposed along a surface of each of the plurality of fibers, each light-emitting element having first and second electrodes between which the electrical signal is applied to cause the light-emitting element to emit light. Means operably associated with each of the plurality of fibers propagates an information-representative signal along each fiber, and a plurality of detectors are disposed along each of the fibers and each is operably associated with one of the plurality of light-emitting elements for selectively applying the electrical signal thereto in response to the information-representative signal propagating along said fiber, thereby causing ones of the light-emitting elements to emit light to display the information.

BRIEF DESCRIPTION OF THE DRAWING

The detailed description of the preferred embodiments of the present invention will be more easily and better understood when read in conjunction with the FIGURES of the Drawing which include:

FIGS. 1A and 1B are diagrams illustrating a large-area flat panel display;

DESCRIPTION OF THE PREFERRED EMBODIMENTS

Figure 1A:
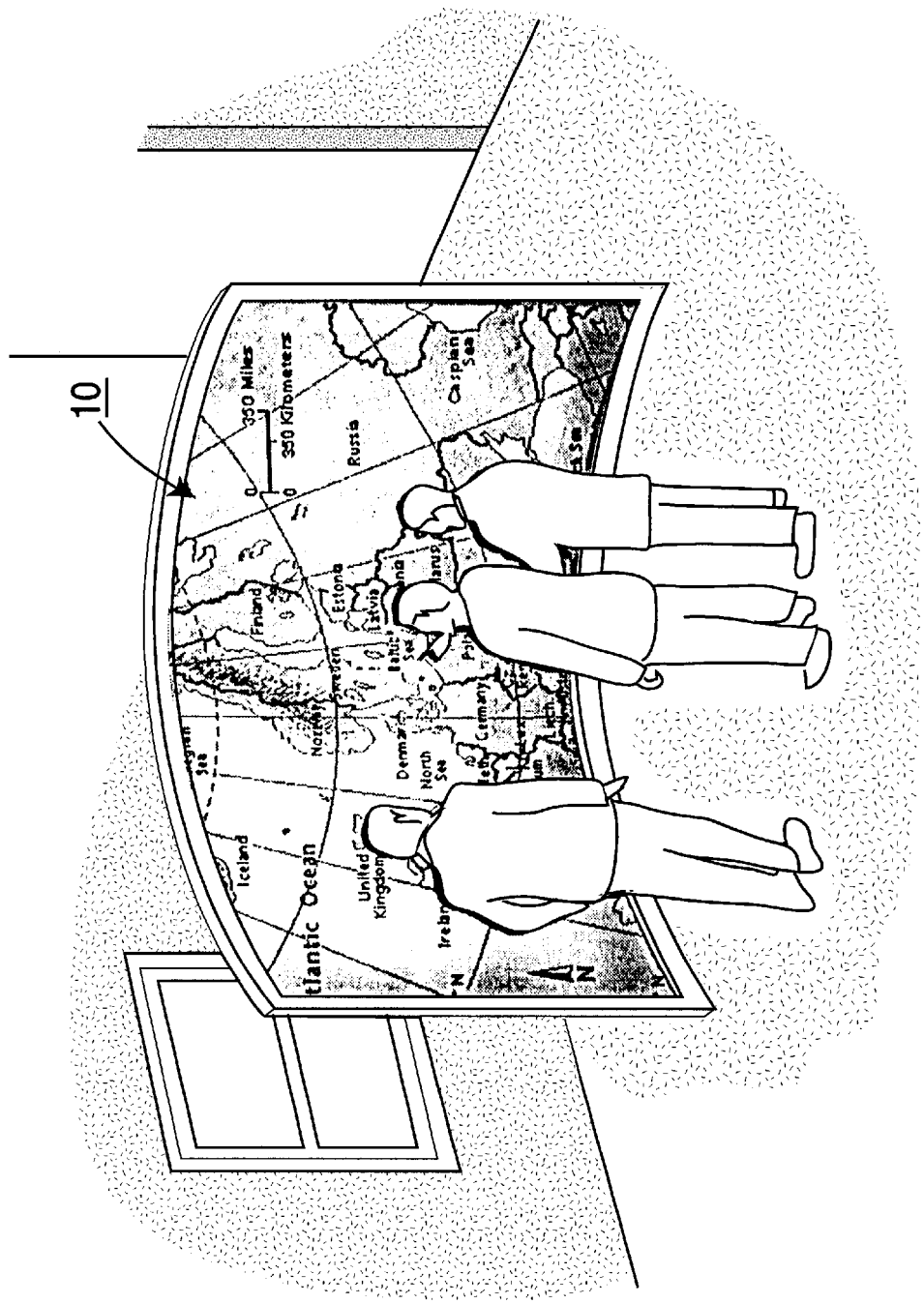

FIG. 1A illustrates an exemplary large-area flat panel display 10 on which an image or information is displayed. As used herein, image and/or information are used interchangeably with respect to what is displayed on a display device, and are intended to encompass any and all of the wide variety of displays that a user may desire, including, but not limited to, visual images and pictures, whether still or moving, whether generated by a camera, computer or any other source, whether true, representative or abstract or arbitrary, whether or not including symbols or characters such as alphanumeric characters or mathematical notations, whether displayed in black and white, monochrome, polychrome or full color. Large-area display 10 is preferably for direct viewing of information and, as illustrated in FIG. 1B, display 10 may be a flat, i.e. planar, display 10a, or may be a curved, cylindrical (as illustrated) or otherwise non-planar display 10b. Displays 10, 10a, 10b display color images and/or information by activating groups of contiguous pixels providing image information in three respective colors formed, for example, of a repeating sequence of red- (R), green- (G) and blue- (B) colored-light-emitting stripes 12R, 12G, 12B, similar to the colored phosphor stripes as in a conventional television CRT.

Figure 2:
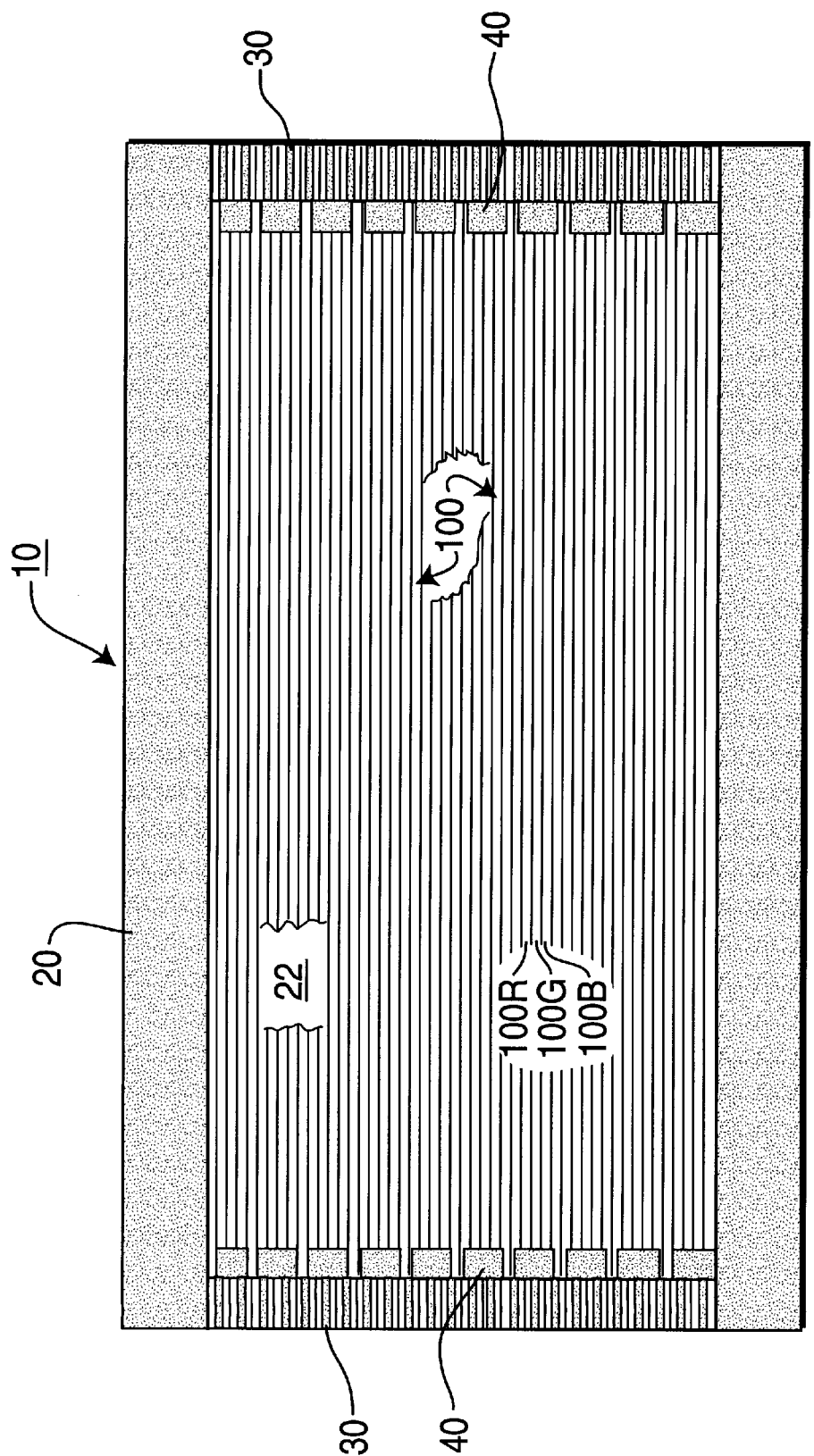
FIG. 2 is a plan view of an exemplary embodiment of a light-emitting fiber display in accordance with the present invention.

FIG. 2 shows a front plan view of an exemplary embodiment of a display 10 in accordance with the present invention. Display 10 includes a plurality of elongated light-emitting display fibers 100 arranged horizontally in a side-by-side arrangement, in particular, in a substantially parallel side-by-side arrangement, extending substantially the full dimension of display 10 to define the "screen" or viewing surface 22 of display 10. As will be described in detail below, each of light-emitting fibers 100 has a plurality of light-emitting elements 150 (described below) disposed along the length of a long flexible fiber or ribbon ("fiber") 110 to form a linearly addressed array of light-emitting elements 150. When placed side-by-side, a plurality of such light-emitting fibers 100 form a two-dimensional array of light-emitting elements 150. If such array has a number N of such fibers 100, and each fiber 100 has a number M of light-emitting elements 150 thereon, then an M×N element display 10 is formed, as seen at viewing surface 22.

Each of light-emitting fibers 100 is linearly addressed in that the linear array of light-emitting elements 150 disposed along the length of each fiber 110 is controlled by a signal propagating along the fiber. As is described below, the signal propagating along the fiber may be an optical signal or an electrical signal, and may be modulated or may be multiplexed in time or frequency. Such signal includes information for addressing particular ones of the light-emitting elements 150 and for controlling the amount of light, i.e., the intensity of light, emitted thereby. Such signal my be in an analog or a digital signal format and may be propagated directly or may be modulated on a radio-frequency, microwave or light wave (optical) carrier signal. Preferably, the serially connected set of pixels disposed along the fiber are addressed by a multiplexed control or triggering signal transmitted along a single transmission path along the fiber so that each pixel may be selected to be "on" for the appropriate times to display a bright gray scale image. Frequency modulation of the carrier is preferred, however, other forms of modulation may also be employed.

In addition to a bright image, another advantage of this linear addressing arrangement of the present invention is that each light-emitting fiber 100 is complete in itself and operates without interconnection with other adjacent fibers, as is the case for matrix addressing as is often utilized. Matrix addressing and X-Y addressing require electrical interconnection of all pixel elements in each row and in each column of a display, and can become cumbersome for large-size displays. The elimination of electrical connections between adjacent fibers eliminates the structures that would otherwise be needed to provide such interconnection, and the complexity and cost thereof. This also simplifies the process of assembly of display 10 and reduces the cost thereof.

In a color display 10 for displaying a color image, the light-emitting fibers 100 are arranged side-by-side in a repeating sequence of single-color fibers 100 that emit red (R), green(G) and blue (B) color light, respectively, so that each group of adjacent is R, G, B pixels on adjacent R, G and B fibers 100 provides a color pixel, and the display 10 displays a color image. As is described in greater detail below in relation to FIGS. 3 and 4, light emission from fibers 100 is preferably from an organic light-emitting diode (OLED) material 130 positioned between an optically-transparent conductive electrode 120 on one face or surface of a transparent fiber 110 and a metal contact 140 that together define the pixel geometry of light-emitting fiber 100. In one arrangement, light emitted from light-emitting fibers 100 exits the OLED pixel by passing through transparent electrode 120 and a transparent fiber 110. In an alternative arrangement, light emitted from light-emitting fibers 100 exits the OLED pixel by passing through a transparent electrode 140.

The light-emitting fibers 100 are mounted to and electrically connected to interconnection structure substrate 20 of display 10 as described in detail below. Where light-emitting fibers 100 are mounted so that the light they emit is directed away from substrate 20, then the displayed image is viewed directly, i.e by viewing the array of light-emitting elements of the array of light-emitting fibers 100 directly. Thus, the outward-facing surfaces of light-emitting fibers 100 are viewing surface or screen 22. In this case, substrate 20 need not be, and preferably is not, transparent or translucent. On the other hand, where light-emitting fibers 100 are mounted so that the light they emit is directed towards substrate 20, then the displayed image is viewed indirectly on the rear surface of substrate 20 which is viewing surface 22. In this case, substrate 20 must be transparent or translucent to permit light to pass therethrough for viewing.

Substrate structure 20 is a generally planar circuit substrate 20 which preferably is formed of an insulating material having patterned electrical conductors 30. Substrate 210 includes a plurality of patterned electrical conductors 30 for interconnecting the various elements of substrate 20 and the electronic devices 40 mounted thereon to the panel of light-emitting fibers 100. Specifically, contacts 30 form edge connector contacts to which conventional edge connectors may be attached for providing the image representative signals that define the image to be displayed on display 10. Also mounted to substrate 20 are electronic devices 40, preferably electronic integrated circuits, for providing the signals that are applied to the respective light-emitting elements 150 on fibers 100 to cause an image or information to be displayed on the viewing surface 22 of display 10. Driver circuits 40 are preferably mounted to the top surface of substrate 20 to receive via conductors 30 electrical signals representative of an image or information to be displayed on display 10 and, in response thereto, generate picture element selection and control signals that are carried along light-emitting fibers 100 to be applied to the appropriate light-emitting elements 150 thereof. As will be described below, such picture element selection and control signals may be carried along fibers 100 on conductors as electrical signals or through a transparent fiber 110 as optical signals.

The side-by-side array of light-emitting fibers 100 of display 10 may advantageously be employed to fashion a display 10 of virtually any desired size or aspect ratio. All of the fibers 100 are preferably of the same type and may be cut to any desired length, and so the fiber 100 itself is not limiting as to the size or shape of the display. The height of the display 10 (i.e. distance from top to bottom in the display orientation of FIG. 2) may easily be changed by simply changing the number of the light-emitting fibers 100 that are arrayed side-by-side. The width of display 10 (i.e. from side to side in the display orientation of FIG. 2) may easily be changed by simply changing the length of the light-emitting fibers 100 that are placed in the side-by-side array, for example, by simply cutting the fibers 100 to a desired length.

In addition, another advantage of the present arrangement is that the driver circuits 40 may be tested before attachment to substrate 20, which may itself be tested before assembly of drive circuits 40 thereto, thereby substantially reducing the likelihood of fabricating a defective interconnection structure 20 that would need repair. Further, the arrangement incorporating edge connectors 30 along various ones of the edges of interconnection structure 20 facilitates ease of assembly of display 10 into a final product and, in the unusual event that service or repair become necessary, disassembly therefrom.

Any convenient number of fibers 100 may be placed side-by-side to obtain the desired height of display 10, and any convenient number of conductors 30 and driver circuits 40 may be employed to drive groups of the rows of light-emitting fibers 100 to obtain that desired height. In general, it is convenient for the number of conductors 30 for each driver circuit 40 and of the number of fibers 100 for each driver circuit 40 to be $2^n$ so that efficient use is made of the digital signal bits that are carried on such parallel paths. With respect to the number of light-emitting fibers 100 that are driven by each driver circuit 40, however, the fact that subsets of three adjacent fibers (one each of red, green and blue emitting type) provide subsets of three adjacent sub-pixels that together form one color pixel should be considered in addition to the efficient use of digital signal capacity. It is presently preferred that each of driver circuits 40 drive up to $2^5=32$ fibers 100, and so groups of 30 fibers are driven by each driver circuit 40, although greater numbers of fibers could be so driven, e.g., 240 out of $2^8=256$ fibers 100. Thus, $2^5=32$ conductors 30 are provided for addressing fibers 100 through driver circuit 40, in addition to conductors 30 for providing image-representative data, and for power supply and ground connections.

Thus it is evident that the repetitiveness of fibers 100 and of driver circuits 40 and of the conductors 30 connecting thereto, facilitates easy expansion or contraction of interconnection structure 20 in either the horizontal or vertical dimension, by simply adding or removing rows or columns of fibers 100 and driver circuits 40 quickly and without substantial expense. Moreover, the arrangement describes lends itself to the simple addressing of display picture elements via edge contacts 30 without the added complexity and cost associated with other addressing schemes. In any event, with the plentiful and inexpensive integrated circuits available for processing image data, such as the 450 MHZ–500 MHZ Pentium® and other micro-processors now available, formatting and reformatting image data for a particular display, such as to reorient the fibers 100 from a horizontal orientation to a vertical orientation, is easily and cheaply accomplished.

Where substrate 20 need not be transparent or translucent, it may be formed as a conventional multi-layer printed wiring circuit board or as a multi-layer ceramic substrate, such as a low-temperature co-fired ceramic material structure laminated to a metal base sheet (LTCC-M substrate). An LTCC-M substrate typically has a metal base sheet that provides strength and preferably has a coefficient of thermal expansion that closely matches that of the ceramic layers, for example, a titanium sheet. One or more ceramic layers of substrate 20 are cut from tapes or sheets of green ceramic material formed from a slurry of ground powdered glasses, such as zinc-magnesium-borosilicate glass and magnesium aluminosilicate glass, inorganic fillers, organic binders, resins, surfactants and solvents. Electrical conductors 30 are typically formed by depositing patterns of conventional electrically-conductive thick-film inks on the ceramic layers before they are laminated together and to the metal sheet and are fired. It is noted that such substrates may be formed in curved and other shapes as may be convenient or desirable for a particular application prior to firing. Such substrates are described, for example, in U.S. application Ser. No. 09/354,516, filed Jul. 15, 1999 and entitled "FIELD EMISSION DISPLAY WITH MULTI-LAYER CO-FIRED CERAMIC SUBSTRATE", in U.S. application Ser. No. 09/088,501 filed Jun. 1, 1998, and entitled "BACK PANEL FOR A PLASMA DISPLAY (now U.S. Pat. No. 6,168,490) and in U.S. application Ser. No. 09/042,076, filed Mar. 13, 1998 and (now U.S. Pat. No. 6,140,767 entitled "PLASMA DISPLAY HAVING SPECIFIC SUBSTRATE AND BARRIER RIBS"), which are hereby incorporated by reference herein in their entireties.

The attaching of light-emitting fibers 100 to substrate 20 in making display 10 is as follows. Conductive contacts are formed on each of conductors 30 on substrate 20 to make electrical connections for signals into and out of electronic device 40 and for signals applied to ones of light-emitting fibers 100. Preferably, the conductive contacts are of an electrically-conductive anisotropic adhesive, such as those available commercially from Elform Corporation located in Reno, Nev. Light-emitting fibers 100 are elongated and have a plurality of light-emitting devices thereon formed in a light-emissive material, as is described in detail below. Each of the light-emitting devices 150 of fiber 100 has at least two electrical contacts or electrodes 120, 140 thereon to which electrical drive signals are applied. Advantageously, groups of fibers 100 may be assembled into modules that are, after testing, attached to substrate 20.

As should be evident from the foregoing description, the assembly of display 10 includes the progressive assembly of simpler components and elements into more complex sub-assemblies and finally into a display 10. One significant advantage of this arrangement is the ability to test and, if necessary, repair components and elements at each step of the progressive assembly. For example, with respect to substrate 20, driver circuits 40 and light-emitting fibers 100 can each be tested separately before they are assembled together. Only the lowest complexity non-repairable defective part need be scrapped; all others are repairable; and so only those fibers, if any, that may be damaged during assembly to substrate 20 to make display 10 need be removed and replaced. A defective display 10 that cannot easily be repaired should never occur. Accordingly, the display according to the present invention avoids the problem of prior art displays that have to be scrapped, at great waste and expense, due to some component or element thereof being defective.

Figure 3:
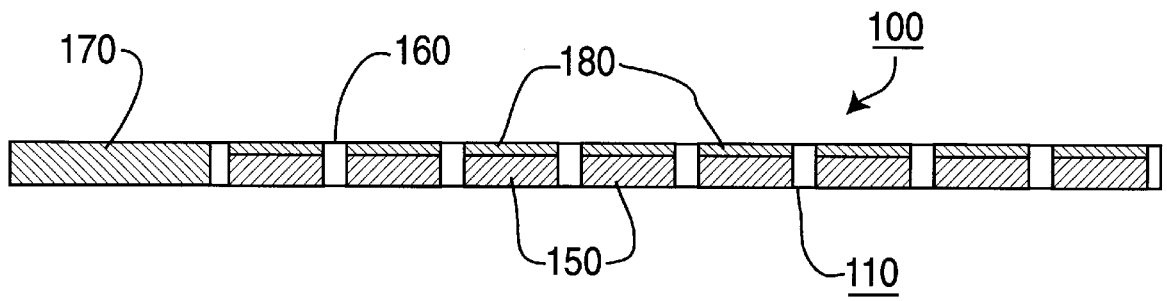
FIG. 3 is a plan view of an exemplary light-emitting fiber useful in the exemplary embodiment of the display of FIG. 2.

FIG. 3 is a plan view of an exemplary embodiment of light emitting fiber 100 which is useful in the display 10 of FIG. 2. Light-emitting fiber 100 is made in long lengths containing a linear array of a substantial number, perhaps hundreds or even thousands, of light emitting elements or pixels 150 on one surface thereof. Each pixel emits light in response to a potential applied between opposing electrodes 120, 140, for example, from a source such as input circuit 170 which may be mounted at one end of fiber 100. Input circuit 170, in addition to providing potentials for causing light-emitting elements to emit light, also provides signals that determine in conjunction with detectors or detector/decoders proximate particular light-emitting elements 150 which of light-elements 150 produce light at any particular time and the intensity of the light so produced. Fiber 100 may also include one or more conductors 160 on the sides thereof for conducting electrical potential and/or signals along fiber 100, including providing electrical potential to the light-emitting elements 150 and/or the detectors or detector/decoders 180 disposed along the fiber 100. Various embodiments of light-emitting fiber 100 useful in display 10 are described below.

Figure 4:
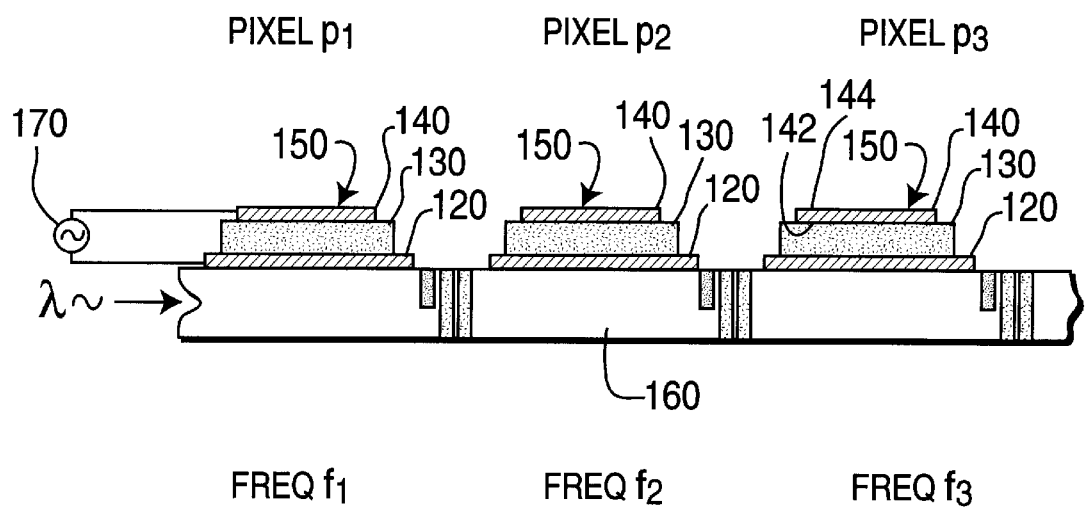
FIG. 4 is a side view of a section of one exemplary embodiment of the light-emitting fiber of FIG. 3.

FIG. 4 is a side view of a portion of one exemplary embodiment of the light-emitting fiber 100 of FIG. 3. Preferably, electrode 120 is transparent and at least one of electrodes 120 and 140 is patterned or segmented to define the light-emitting elements or pixels 150. The light produced by each light-emitting element 150 passes through the fiber 110 which is a transparent fiber, to exit through a viewing surface thereof opposing the surface on which the light-emitting element 150 resides. FIG. 4 shows a short segment of light-emitting fiber 100 having three light-emitting elements 150 thereon.

The core of light-emitting fiber 100 is a long transparent fiber 110 of convenient cross-sectional shape, such as a square, rectangular, trapezoidal, circular or "D" shape, for example, and may be of glass, plastic, sapphire, silicon, silicon dioxide or other suitable material. An optically-transparent conductor 120, such as a thin layer of ITO (indium tin oxide), tin oxide, zinc oxide, or other hole injecting material, is formed along one surface of fiber 110, such as by sputtering, to serve as a hole-injecting first electrode or contact for each of the light-emitting elements 150 of light-emitting fiber 100. Conductive layer 120 may be continuous or may be segmented. A detector or detector/decoder 180, which may be a detector of signal applied to it or which may be such detector and also a decoder of the signals detected, either of which may be referred to herein as a detector or as a detector/decoder, resides on fiber 110 for selectively coupling signal between signal source 170 and one of electrodes 120 and 140. The layer of light-emissive material 130 is formed over transparent conductor layer 120, such as of an organic light-emitting device (OLED) material or an inorganic electro-luminescent (EL) material. A polymer OLED material, typically having a thickness of about 500 Å, is preferred. Light-emissive material 130 may be deposited in a pattern of segmented light-emissive material regions spaced along fiber 100, or may be deposited as a long continuous strip. A pattern of segmented electron-injecting electrodes or contacts 140 is formed on the light-emissive material 130 to provide the second electrical electrode or contact to each of the light-emitting elements 150 and to define discrete pixels of light-emitting material 130 on light-emitting fiber 100. Alternatively, layer 120 may be of an electron-injecting material and electrode 140 of a hole-injecting material. Only one of electrodes 120, 140 need be segmented or patterned to define individual light-emitting elements 150 that are selectively energized by detector/decoder 180 to apply potential from source 170. The one of electrodes 120, 140 that is segmented or patterned may be either the top electrode, i.e. the electrode in the position of electrode 140, or the bottom electrode, i.e. the electrode in the position of electrode 120. It may be desirable to overcoat at least the areas of pixel elements 150 other than contacts 140 with a coating, for example, of silicon nitride, diamond-like carbon, silicon oxide, phospho-silicate glass, silicon carbide, sub-oxides of these materials, oxy-carbides of these materials, or compounds containing any of the foregoing materials and hydrogen resulting from plasma enhanced chemical vapor deposition or epoxy, to reduce moisture absorption or reactive gas absorption by the OLED material.

Specifically, contacts 140 include an electron-injecting cathode electrode 142 formed of a cathode material, such as magnesium, magnesium/silver, calcium or calcium/aluminum or other low work function metal containing material having a thickness of about 1000 Å–2000 Å, spaced apart along fiber 100, each one of which corresponds to a light-emitting element 150 of light-emitting fiber 100. Each cathode electrode 142 is coated with a layer of conductive material 144, such as aluminum, silver, gold or other suitable metal having a thickness of about 1000 Å, as is convenient for subsequent electrical connection to external circuitry. Electrode 142 and contact 144 are preferably evaporated onto OLED layer 130. In operation, potentials are applied to contacts 120, 140 of light-emitting fibers 100 by detector/decoder 180 which is responsive to input circuitry 170 of fiber 100 which is in turn responsive to driver circuit 40 to cause the light-emitting elements 150 of light-emitting fiber 100 to produce light responsive to the value of the data signals at conductors 30, the display 10 formed by the many light-emitting elements 150 of light emitting fibers 100 thereby displaying an image.

Preferably, a metal conductor 160, such as an aluminum, gold or other metal conductor having a thickness of about 10,000 Å to about 100 μm, is formed preferably along one or both of the elongated side surfaces of transparent fiber 110, i.e. the surfaces adjacent to the surface thereof on which the ITO conductor 120 is formed, to serve as a conductive bus or buses along which relatively high current drive signals are distributed to each pixel 150. This is desirable because the sputtered ITO layer 120, which is only about 1200 Å thick so as to be suitably transparent, is too resistive to serve as a good conductor along the length of a long light-emitting fiber 100. Conductors 160 are electrically connected, either directly or through detector/decoder 180, to the thin, hole-injecting transparent conductor 120 or the electron-injecting conductor 140, to provide a low-resistance conductive path in parallel therewith so as to apply potential responsive to drive circuits 40 and input circuit 170 to the contacts 120, 140 of the light-emitting devices 150 along light-emitting fiber 100 without excessive loss of potential that would otherwise result due to the resistance of the long ITO conductor 120. A further advantage of conductors 160, 162 is that they reflect light produced by OLED material 130 thereby reducing undesirable light loss through the sides of transparent fiber 110.

Preferably, input circuit 170 includes an optical modulator that transmits modulated optical signals along transparent fiber 110, which optical signals are preferably frequency modulated, as from an FM modulated solid state laser. The modulated optical signals produced by input circuit 170 include image representative information in the form of address information for each particular light-emitting element 150 along fiber 100 as well as light intensity control information therefor. Each detector 180 along fiber 100 is responsive to the modulated optical signal, for example, a frequency sensitive detector/decoder 180 that activates pixel P1 only when the laser signal contains information at frequency F1, activates pixel P2 only when the laser signal contains information at frequency F2, activates pixel P3 only when the laser signal contains information at frequency F3, and so on. Detector 180 is responsive to the appropriate FM frequency by either having an electrical switching action that selectively applies potential from one of conductive buses 160 to one of contacts 120, 140, and thus to light-emitting material 130 to produce light or by having an optical light switching action that selectively passes and blocks light produced by light-emissive material 130 to which activation potential is applied continuously.

Detector 180 includes a light-sensitive detector which may include a photo-transistor or an optical coupler of a PIN diode, resistor and transistor, or an optically-activated switch, and a frequency-selective circuit such as a tuned electrical circuit, e.g., an inductor-capacitor tuned circuit, that passes the specific modulation frequency assigned to the pixel 150 with which it is associated. When the frequency signal to which a particular detector 180 is responsive is present, detector 180 responds thereto to turn on the particular pixel associated therewith, obtaining the data needed to display the desired light intensity from a frequency pulse or time modulated signal associated with the particular frequency signal. A typical substrate 110 of reasonable width has sufficient space on which to form an inductor-capacitor (L-C) resonant tuned circuit at RF frequencies. Where the length of light-emitting fiber 100 is about 1000 pixels, as might be the case in a practical display 10, the L-C resonant circuit associated with each pixel 150 should have a quality factor Q that exceeds about 1000.

Alternatively, each detector/decoder 180 could have a unique digitally-encoded address for the pixel 150 associated therewith and be responsive to such address being encoded in the optical signal propagating along fiber 100 to turn the light-emitting element 150 on, off, or partially on.

By way of comparison, a process that has a yield of 90% for producing 50-cm (about 20-inch) diagonal conventional displays and a yield of only about 40% for a 125-cm (about 50-inch) diagonal conventional display, would have a yield of about 99.6% for producing a 0.5 mm (0.020 inch) wide by 100-cm (about 40-inches) long fiber 100 from which a 75 cm by 100 cm (about 30 inches by 40 inches) display having about a 125 cm (about 50 inch) diagonal can be made. This advantage of the present invention accrues due to the fact that the yield of a processed fiber 100 is inversely related to the length of fiber 100, whereas in conventional displays the yield of a display is inversely related to the area of the display, i.e. the square of the diagonal of the display. Further, because the individual fibers are preferably tested before assembly in to a display, even if a substantial number of the relatively inexpensive fibers are defective and are thrown away, the effect thereof on the total cost of the display 10 is relatively minor.

Suitable transparent fibers 110 include glass fibers, such as those of borosilicate or soda-lime glass, quartz, sapphire or other suitable glass material, and plastic fibers, such as those of polymethyl-methacrylate (PMMA), polycarbonate, acrylic, Mylar, polyester, polyimide or other suitable plastic material and silicon or other infrared transmitting material. For the case that the display elements are addressed by electrical signals and the light emerges from the top surface of the pixel, metal could be used to fabricate the fiber. A square transparent fiber 110 having a width of 0.5 mm and a height of 0.5 mm, or a rectangular transparent fiber 110 having a width of 0.5 mm and a height of 0.75 mm, is convenient, and is flexible, with the LED elements 150 formed on one of the 0.5 mm wide surfaces with each LED element forming a pixel (picture element) of about 0.5 mm by 1.5 mm. The three-to-one aspect ratio of each pixel 150 and the relatively large pixel size make the light-emitting fibers 100 easy to align into a display 10.

In a color display 10, in particular, three adjacent light-emitting fibers 100 each contribute a 0.5 mm by 1.5 mm monochrome pixel of a different color that together provide a 1.5 mm by 1.5 mm color pixel (e.g., a display 10 has light-emitting fibers 100 arranged side-by-side in a repeating sequence of single-color fibers 100 emitting red (R), green (G) and blue (B) color light, respectively, so that each group of adjacent R, G, B pixels provides a color pixel). Fibers 100 that emit one particular color may be provided in various ways. For example, three different types of light-emitting fibers 100R, 100G, 100B may be fabricated employing the same broadband (i.e. multi-color) light-emitting material 130 on respective colored transparent fibers 110R, 110G, 110B that are tinted each to one of the three desired colors R, G, B, thereby to provide light-emitting fibers 100R, 100G, 100B emitting the three colors R, G and B, respectively. Alternatively, three different narrowband (i.e. single color) light-emitting materials 130R, 130G, 130B that respectively emit one of the desired three colors R, G and B may be deposited on respective transparent fibers 110, thereby to provide light-emitting fibers 100R, 100G, 100B emitting the three colors R, G and B, respectively. Further, respective light-emitting materials 130R, 130G, 130B that emit one of the three colors R, G, B may be deposited on respective correspondingly tinted transparent fibers 110R, 110G, 110B to provide R, G and B light-emitting fibers 100R, 100G, 100B, respectively. It is noted that the use of tinted transparent fibers 110 advantageously reduces the reflection of ambient light by the OLED materials, thereby tending to improve the contrast ratio of display 10.

Where a monochrome display 10 is desired, the desired color may be obtained by employing a transparent fiber 110 tinted to the desired color, a light-emitting material 130 emitting light of the desired color, or both. A clear transparent fiber 110 may also be employed with a broadband light-emitting material 130 that emits light that appears "white" or close to white.

Suitable small molecule OLED structures are known and include ITO as the hole injector, green-emitting OLED fabricated from naphthyl-substituted benzidine derivative (NPB) as the hole transport layer, tris-(8-hydroxyquinoline) aluminum ($Alq_3$) as the electron transport layer, and magnesium/silver as the cathode, which are available commercially from Aldrich Chemical Company located in Milwaukee, Wis.

Red emission is obtained by doping the $Alq_3$ layer in the foregoing OLED structure doped with 6% 2,3,7,8,12,13,17, 18-octaethyl-21H,23H-porphine platinum (II) (PtOEP) as reported by D. F. O'Brien et al in the Extended Abstracts of The Fourth International Conference on the Science and Technology of Display Phosphors & 9th International Workshop on Inorganic and Organic Electroluminescence, Sep. 14–17, 1998, at page 37 et seq. Blue emission is obtained in the foregoing OLED structure by including an additional layer. This OLED structure includes spiro-linked TAD (spiro-TAD) as the hole transport layer, spiro-linked sexiphenyl (spiro-6Φ) as the blue emitter layer, and Alq$_3$ as the electron transport layer as reported by Frank Weissortel et al in Extended Abstracts of The Fourth International Conference on the Science and Technology of Display Phosphors & 9th International Workshop on Inorganic and Organic Electroluminescence, Sep. 14–17, 1998, at page 5 et seq.

Small-molecule OLED materials may be applied by evaporation and polymer OLED materials may be deposited as monomers, for example, using ink jet printing, roller coating, screen printing and the like to deposit mixtures of the OLED material and suitable solvents as is known, and subsequently evaporating the solvent(s) and polymerizing the monomer by heating.

For a polymer OLED structure, ITO may be employed as the hole injector layer and a thiophene derivative commonly known as PEDT synthesized by Bayer AG located in Ludwigshafen, Germany, as the hole transport layer. The electron transport/emissive layer can by a poly(fluorene)-based polymer for green emission, and other polymers for red and blue emission, as reported by J. H. Burroughes in the Extended Abstracts of The Fourth International Conference on the Science and Technology of Display Phosphors & 9th International Workshop on Inorganic and Organic Electroluminescence, Sep. 14–17, 1998, at page 133 et seq.

Detector/decoder 180 includes a memory for storing the value of energizing signal to be applied to a given light-emitting element 150, so that while each detector/decoder 180 is addressed only periodically, the time duty cycle of the energizing signal applied to light-emitting element 150 can approach 100%. As a result, the OLED material 130 may be utilized to produce close to its maximum available performance under DC drive conditions, so that the OLED material 130 may be operated to produce a very high brightness, or for maximum efficiency, or at some compromise thereof, as may be convenient and desirable in a particular application.

Displays 10 having 0.5 mm by 1.5 mm monochrome R, G and B sub-pixels to provide 1.5 mm by 1.5 mm color pixels as described are suitable for providing an about 125 cm (about 50 inch) diagonal dimension display in a 640 by 480 pixel format or an about 190 cm (about 75 inch) diagonal dimension display in a 1000 by 750 pixel format, for example. In addition, an 2.7 m wide by 1.6 m high (about 9 feet by 5.3 feet) display 10 in a 1920 pixel by 1080 pixel format is suitable for display of high-definition television (HDTV) images, and would include 3240 horizontal fibers which in groups of three (for R, G, B) provide 1080 color pixels in the vertical direction.

Where OLED layer 130 is segmented, for example, into 0.5 mm by 1.5 mm segments, contacts 140 formed thereon may be made slightly smaller, for example 0.4 mm by 1.4 mm, so as to avoid undesirable electrical conduction to ITO layer 120 and/or detector 180 around the edge of OLED layer 130 as might otherwise occur due to tolerances in the relative positions of segments of OLED layer 130 and contacts 140. Where decoder/detector 180 requires electrical potential to operate, such potential may be supplied by intentionally depositing conductors between contact 140 and detector 180 or between the two conductors 160, 162 supplying potential along light-emitting fiber 100.

For purposes of description only, the fibers 100 are usually illustrated and are sometimes described as being positioned with their lengths lying in a horizontal direction, although fibers 100 may lie an any desired direction an any particular application of a display 10 including the present invention. Thus, groups of picture elements may be referred to as being "rows" or "columns" of display 10, although the arrangement of electrical circuits for driving light-emitting fibers 100 may be interchanged, thereby interchanging what are called rows and columns. Likewise, display 10 is usually shown with a relatively longer horizontal dimension and a relatively shorter vertical dimension, and with a generally planar viewing surface 22, as is customary for television and cinema screens, although any aspect ratio, i.e. the ratio of the horizontal dimension to the vertical dimension, and various curvatures and shapes, may be employed in any particular application of a display 10 including the present invention. In addition, the actual orientation need not have the items described as horizontal or vertical in a horizontal or vertical orientation. Light-emitting fibers 100 may extend horizontally across the width of a display 10 or vertically along the height thereof, or otherwise, as is convenient, thereby producing a visually "seamless" large area display 10, i.e. a display not having seams or non-image regions at the edges of adjacent display devices that are stacked in a matrix (i.e. are tiled) to form a larger area display.

Figure 5A:
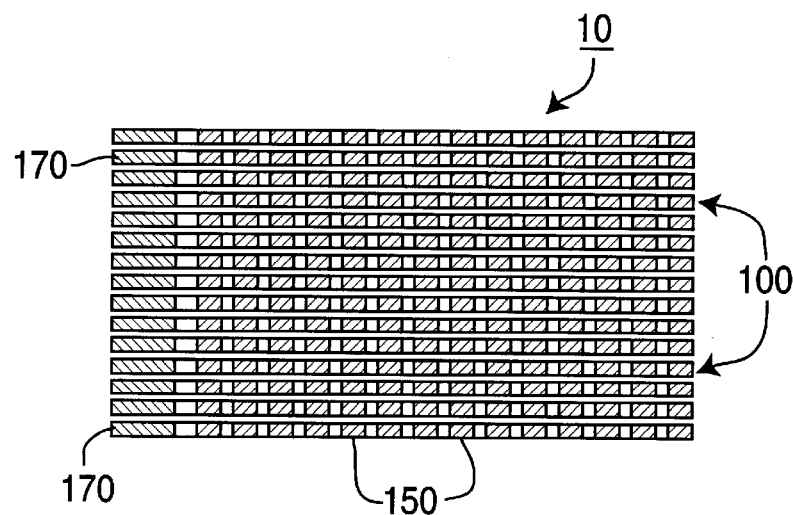
FIGS. 5A and 5B are plan views of alternative arrangements of light-emitting fibers in an exemplary display as in FIGS. 1A, 1B and 2.
Figure 5B:
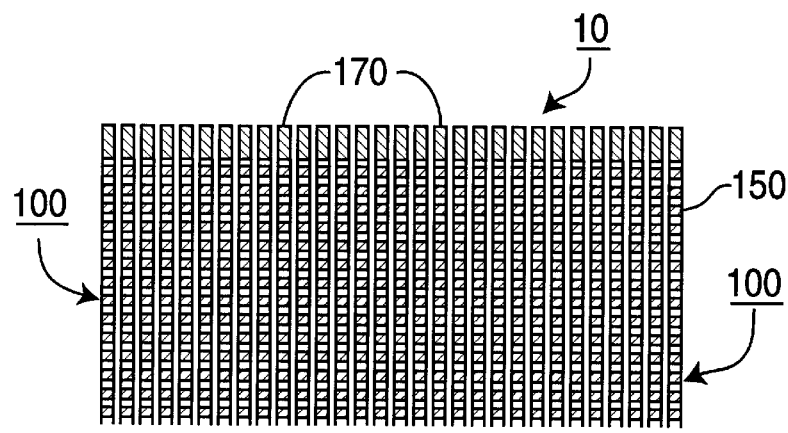
Figure 6:
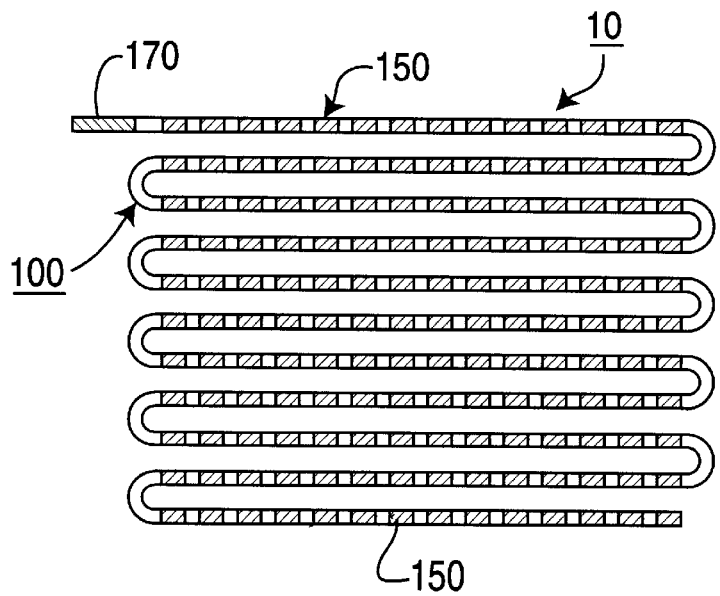
FIG. 6 is a plan view of an alternative exemplary arrangement of the light-emitting fiber in an exemplary display as in FIGS. 1A, 1B and 2.

FIGS. 5A, 5B and 6 show such alternative arrangements of light-emitting fibers 100 forming display 10. In FIG. 5A, a relatively smaller number of relatively longer light-emitting fibers 100 are arranged side-by-side in horizontal rows to provide a display 10 having a wide-aspect horizontal format, as is usual for a video display such as television. In FIG. 5B, on the other hand, a relatively larger number of relatively shorter light-emitting fibers 100 are arranged side-by-side in vertical columns to provide a display 10 having a narrow-aspect vertical format, as might be useful for signs or word processor displays. Further, the arrangement of FIG. 6 employs a much longer light-emitting fiber 100 that is folded with alternating folds to form a serpentine shape with closely spaced relatively long straight sections forming display 10. This serpentine arrangement may employ monochrome pixels 150 or may employ a repeating sequence of alternating red, green and blue pixels 150 along fiber 100 to provide a color display. In each of these arrangements, each light-emitting fiber 100 includes an input circuit at one end thereof and appropriate detectors 180 proximate the light-emitting elements 150.

Although it is preferred that rows of display 10 be driven by driver circuits 40 in groups of subsets of three fibers totaling close to $2^n$ adjacent light-emitting fibers 100 as described above, it is likewise convenient that each fiber 100 be of a length having $2^n$ pixels 150, e.g., lengths of 512 or 1028 or 2056. This arrangement facilitates the preferred linear addressing of subsets of pixels along individual light-emitting fibers 100 that allows convenient expansion or contraction of the size, either in width or height or both, of display 10. It may be convenient, however, that numbers of pixels between those numbers of pixels that are $2^n$ pixels be so driven to obtain a desired width of display 10. In such case, fiber 100 can be driven from both ends apportioning the number of pixels between input circuits 170 at opposite ends of light-emitting fiber 100 for efficient utilization of the driver circuits 40 and input circuits 170.

The assembly sequence of display 10 is as follows. Transparent fiber 110 receives a sputtered ITO conductor layer 120 and sputtered metal conductors 160. Detector 180 may be fabricated directly on transparent fiber 110 or may be fabricated separately and mounted thereon. When detector 180 is fabricated separately, it is preferably pretested, i.e. previously tested prior to mounting and found to operate properly. An OLED layer 130, which may or may not be segmented, is coated over contact 120 and contact layer 140 formed thereon by evaporative deposition of magnesium (or calcium or other material containing a low work function metal) layer 142 and then of silver (or aluminum or other appropriate conducting material) layer 144 thereover. Either ITO layer 120 or contact layer 140 is patterned, thereby forming light-emitting elements 150 along transparent fiber 110. Light-emitting fiber 100 may be tested at this point. Input circuits 170, preferably pretested, are mounted on the end of each light-emitting fiber 100 and each complete fiber 100 is tested. Driver circuits 40, preferably pretested, are mounted to substrate 20. Plural light-emitting fibers 100 are arranged side-by-side on substrate 20 with close spacing to assemble a display 10 panel. These assembly operations may be automated to further reduce the assembly cost of displays according to the present invention. It is noted that the combination of closely spaced light-emitting fibers 100 with closely spaced light-emitting elements 150 thereon produces a large area display 10 that is free of seams and other inactive areas on the display viewing surface that decrease the areal utilization efficiency thereof, and yet has the advantages associated with the modular construction such as is afforded by the closely-spaced light-emitting fibers 100.

Alternatively, display 10 may be assembled in modular fashion, as may be convenient to further minimize the waste should defective components or assembly occur. In this alternative process, groups of a convenient number of pretested light-emitting fibers 100, for example, a group of up to $2^n$ adjacent fibers 100 containing a number of subsets of three fibers, such as a subset of 30, 60, or 120 adjacent fibers 100, are assembled into a sub-panel (i.e. a subassembly) with one pretested driver circuit 40 mounted on a circuit board that is mounted to substrate 20. Such sub-panel extends the full width of display 10 which is defined by the length of light-emitting fibers 100. These sub-panels are tested before a number of sub-panels are positioned adjacent one another on substrate 20 to form display 10.

A display 10 as described will display an optically monolithic or unitary image, even though the electronic circuitry driving the light-emitting fibers 100 are electrically separated for addressing display 10 in a modular fashion. Based upon reports of the performance of multiplexed panel displays such as reported by Y. Fukuda et al in Society for Information Display International Symposium, Digest of Technical Papers, May 1999, (SID 99 Digest), at pages 430–433, display 10' has the potential to provide high-brightness at high luminance efficiency (e.g., about 150 $Cd/m^2$ at 0.6 Lm/W where 120 select lines are multiplexed as a group driven by one select line driver circuit 240; about 600 $Cd/m^2$ at 2.4 Lm/W where 30 select lines are multiplexed as a group ), high resolution (e.g., 32 lines/cm or 80 lines/inch), and a color gamut comparable to a CRT, all in a display that is substantially larger than is practical for a CRT. Typically, where substrate 20 is a transparent faceplate it may be about 1.5 mm (about 0.060 inch) thick, and have 0.5 mm by 0.5 mm (about 0.020 by 0.020 inch) light-emitting fibers 100 mounted thereon, preferably placed by automated and/or robotic equipment. If drive circuits 40 are mounted on separate circuit boards, such circuit boards may be of about 50 $\mu$m (about 0.002 inch) thick polyimide, polyester, FR4 or other suitable material, and are also preferably placed by automated and/or robotic equipment.

An additional advantage of the arrangement having a plurality of parallel driver circuits 40 and input circuits 170 that each process the image-representing signals for a linear array of pixels in a particular row of the display 10 is that the drive voltage level corresponding to the data signals to these groups of pixels may be maintained by the detectors 180 until refreshed or changed on the next cycle of information. This is aided by parallel processing in the plurality of parallel driver circuits 40 and input circuits 170, so as to provide the display of high brightness, full color, full motion video images. The low potentials of less than about 10 volts required to drive each pixel 150 are easily provided. Because the OLED is actually an electrical diode, contrast ratios of greater than 100 are easily obtained with direct (DC) driving of the linearly addressed OLED elements.

It is noted that substrate 20 may be a flexible material that allows, since light-emitting fibers 100 are also flexible, display 10 to be shaped, such as into a curved display as illustrated in FIG. 1B, for example.

Figure 7:
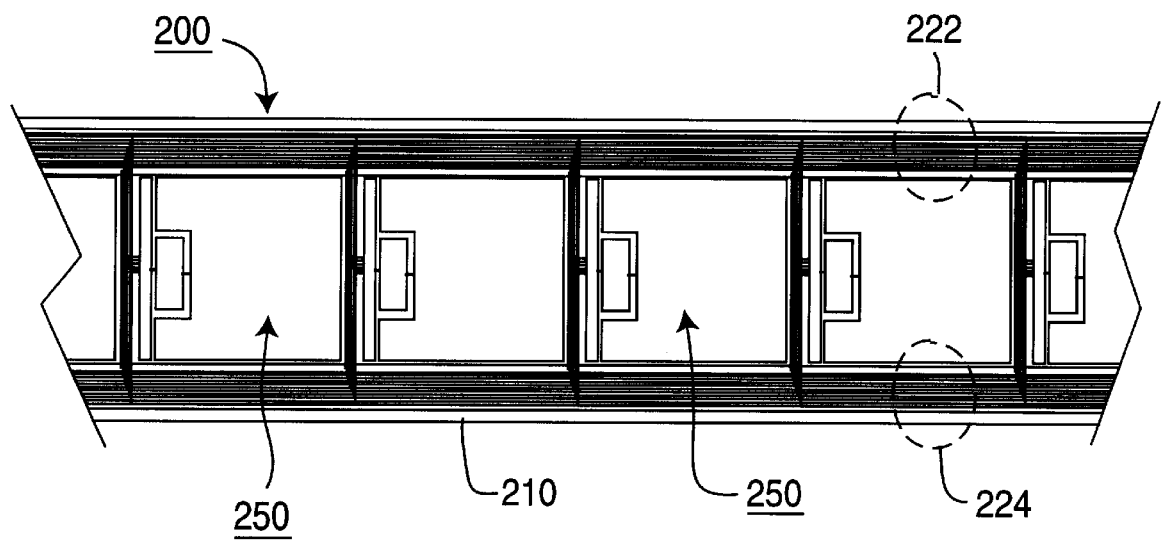
FIG. 7 is a plan view of a section of another exemplary embodiment of the light-emitting fiber of FIG. 3.

FIG. 7 is a plan view of a section of another exemplary embodiment of the light-emitting fiber 100 of FIG. 3 that is linearly addressed by electrical signals propagating thereon from a driver circuit 170 at one end thereof. This alternative light-emitting fiber, designated as fiber 200, has a plurality of light-emitting elements 250 disposed in linear array along the length of fiber 200. Light-emitting fiber 200 is formed on a fiber or ribbon flexible substrate 210 which may be a transparent fiber as described above, or may be a silicon fiber or ribbon, a Kapton® or other polyimide, FR4 or other printed circuit material, low temperature co-fired or other ceramic, or other material that can be made into long flexible strips, fibers or ribbons. Electrical conductors 222, 224 lie along the entire length thereof for conducting electrical power for light-emitting elements 250 and detectors or detector/decoders 280 disposed along light-emitting fiber 200 and addressing and pixel information for each light-emitting element 260 along light-emitting fiber 200. Thus, pixels 250 are fully addressable and are serially connected along light-emitting fiber 200.

Figure 8:
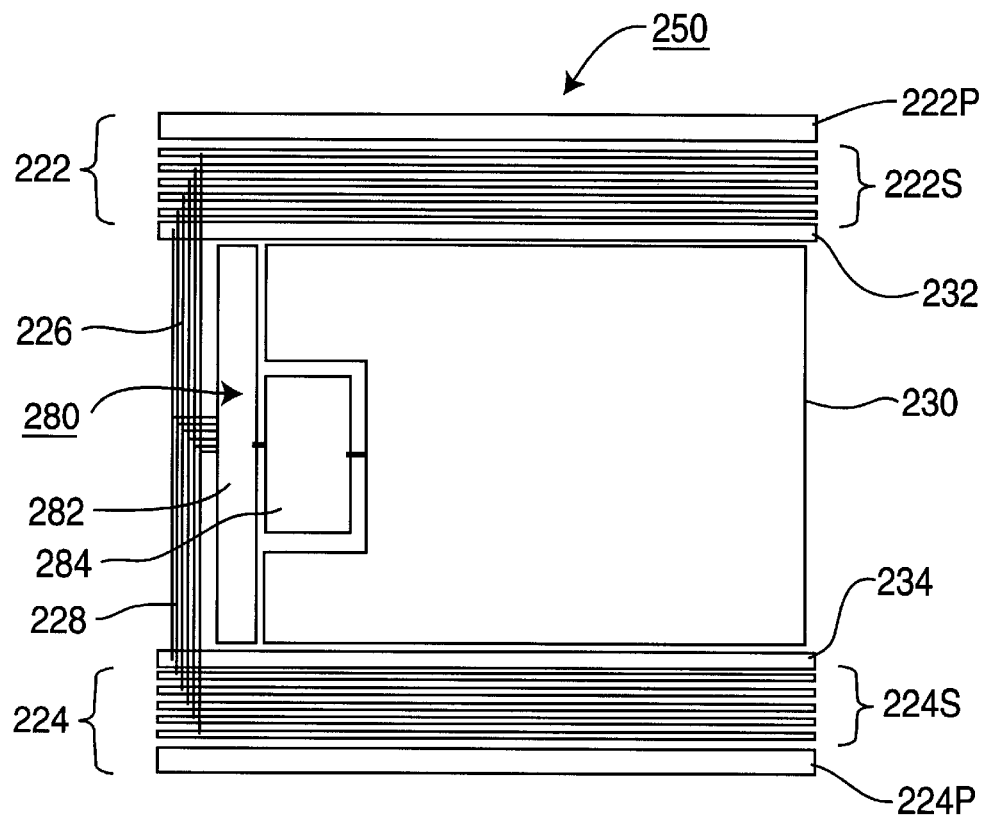
FIG. 8 is an expanded plan view of a light-emitting element of the section of the alternative embodiment of the light-emitting fiber of FIG. 7.

As may best be seen in relation to FIG. 8, which is an expanded plan view of one light-emitting element 250 of the section of the alternative embodiment of the light-emitting fiber 200 of FIG. 7, each pixel element 250 includes a light-emitting element 250 per se, a portion of a scanner circuit 232, 234, a detector 280 and associated conductors 222, 224, 226, 228. Scanner circuit 232, 234 is preferably a plural-stage shift register distributed along the length of light-emitting fiber 200 and having one stage associated with each pixel 250. Scanner circuit 232, 234 is clocked by driver circuit 170 to select the particular pixel 250 that is to respond to the pixel data present on data bus 222S, 224S at each particular time interval. In a five-bit pixel data encoding arrangement, data bus 222S, 224S is a preferably a five-bit parallel (i.e. five-conductor) digital data bus. Transverse conductors 226, 228 couple pixel selection data from scanner circuits 232, 234 and digital pixel data from data bus 222S, 224S to the detector/decoder 280 associated with that particular pixel 250. Power conductors 222P, 224P provide operating potential to each pixel 250 including the EL or OLED light emitting material 230, the scanner circuit 232, 234 and the detector/decoder 280 associated therewith.

Scanner circuits 232, 234 and detectors 280 can be fabricated as amorphous silicon integrated circuits, and redundancy can be built into those circuits, as well as into data bus conductors 222S, 224S, to increase the production yield of operable pixels 250 and the reliability of fibers 200. It is noted that the clocking pulses for scanner circuits 232, 234 propagate along fiber 200 on conductors 222S, 224S that are of the same arrangement (i.e. geometry) as are the conductors 222S, 224S along which pixel information propagates, thereby tending to have both scanner signals and pixel information signals arrive at any particular pixel 250 along fiber 200 substantially synchronized in time, which facilitates fibers 200 having long lengths, e.g., lengths sufficient to include linear arrays of one or more thousands of pixels 250.

Each detector 280 receives pixel selection and intensity information transmitted along conductors 222, 224 of light-emitting fiber 200 by driver circuit 170 thereof and applies appropriate potential from conductors 222, 224 responsive thereto to the EL or OLED light-emitting material 230 associated therewith. Preferably, each detector/decoder 280 includes logic circuitry 282 that detects and stores the pixel brightness information for the pixel 250 with which it is associated and decodes same into signals representative of the level and timing of potentials to be applied to the OLED material 230 associated therewith. Drive circuitry 284 is responsive to such level and timing representative signals to apply at the appropriate times the corresponding level of potential to OLED material 230, thereby causing each light-emitting element 250 to emit the appropriate intensity of light for the pixel it represents in the image to be displayed by fibers 200 in the display 10. Preferably, pixels 250 are addressed in turn.

It is noted that OLED material 230 may be on the same surface of flexible fiber substrate 210 as are logic circuitry 282 and drive circuitry 284, as is shown in FIG. 8, in which case the area of light-emitting material 230 is reduced by the area occupied by electrical conductors 222, 224, scanner circuits 232, 234, logic circuitry 282 and drive circuitry 284. Alternatively, OLED material 230 may be on the opposite surface of fiber substrate 210 and so may have a larger area, thereby to increase the amount of light it can produce and the light intensity and efficiency of display 10. Also alternatively, conductors 222, 224 may be on the opposite surface of fiber substrate 210, or power conductors 222P, 224P can be on side surfaces thereof.

Typically, light-emitting elements 150, 250 are addressed in sequence in the same order as their physical location along light-emitting fiber 100, 200, i.e. beginning at one end thereof and progressing to the opposite end thereof on each addressing cycle. However, it may be desirable to employ different addressing sequences, such as addressing adjacent fibers or adjacent groups of fibers beginning from opposite ends, or addressing pixels along a fiber in a sequence other than the order of their physical positions along the fiber. Light-emitting fibers 100, 200 may also be driven from both ends, if desired or convenient.

Brightness (or light intensity) control may obtain from simple on-off control, i.e. turning each particular pixel 150, 250 on or off each time it is addressed and remaining in that state until the next time it is addressed, or by time modulating (pulse-width modulation (PWM)) of each pixel, in which case decoder detector 180, 280 receives on-off ratio information and applies potential to light-emitting material 130, 230 for a corresponding portion of a defined time period. Detector 180, 280 may be simple in that it directly applies the received on-off ratio information to light-emitting material 130, 230 or may be more complex to decode the on-off ratio information in the received on-off ratio information into time-based PWM signals applied to light-emitting material 130, 230. Alternatively, PWM pixel activation may be obtained directly where scanner circuitry 232, 234 is sufficiently fast to address all the pixels within the time period of the PWM signals.

One aspect of detector/decoder 180, 280 employing frequency selective decoding or digitally-encoded pixel brightness information described above is that each pixel requires a detector/decoder 180, 280 that is unique from the other detector/decoders of light-emitting fiber 100, 200. Fabrication of fibers 100, 200 is preferably a continuous process in which the layers 120, 130, 140, 160, 162, for example, are deposited and formed along a long length of fiber 110, 210 as the fiber travels from a supply reel to a take up reel, which requires controlled-environment chambers enclosing smaller volumes and is therefore less expensive. However, fabrication also requires some customization of each detector 180, 280 in fabricating fiber 100, 200, either during processing, such as by computer controlled laser exposure and ion or plasma etching, or as a separate post-processing operation, such as by laser trimming of identical circuits formed at each pixel location, for example, to adjust the frequency response thereof or to encode an address identification therein, or to otherwise customize the individual circuits associated with each particular pixel.

The foregoing can be avoided by using the pixel selecting scanner circuits 232, 234 described above, which is a shift register distributed along light-emitting fiber 200 that includes at least one shift register stage associated with each pixel 250. The pixels can then be addressed in the sequence of the order of their physical locations along light-emitting fiber 200 as shift register scanner circuits 232, 234 are clocked. During each time period that each particular pixel is addressed, a drive level signal for that pixel applied to data bus 222S, 224S by driver circuit 170 is latched into logic circuit 282 of the detector/decoder 280 associated with that particular pixel to establish the drive level to be applied to light-emitting element 230 by its drive circuit 284 until that pixel is next addressed in the next sequence of addressing the pixels.

Figure 9:
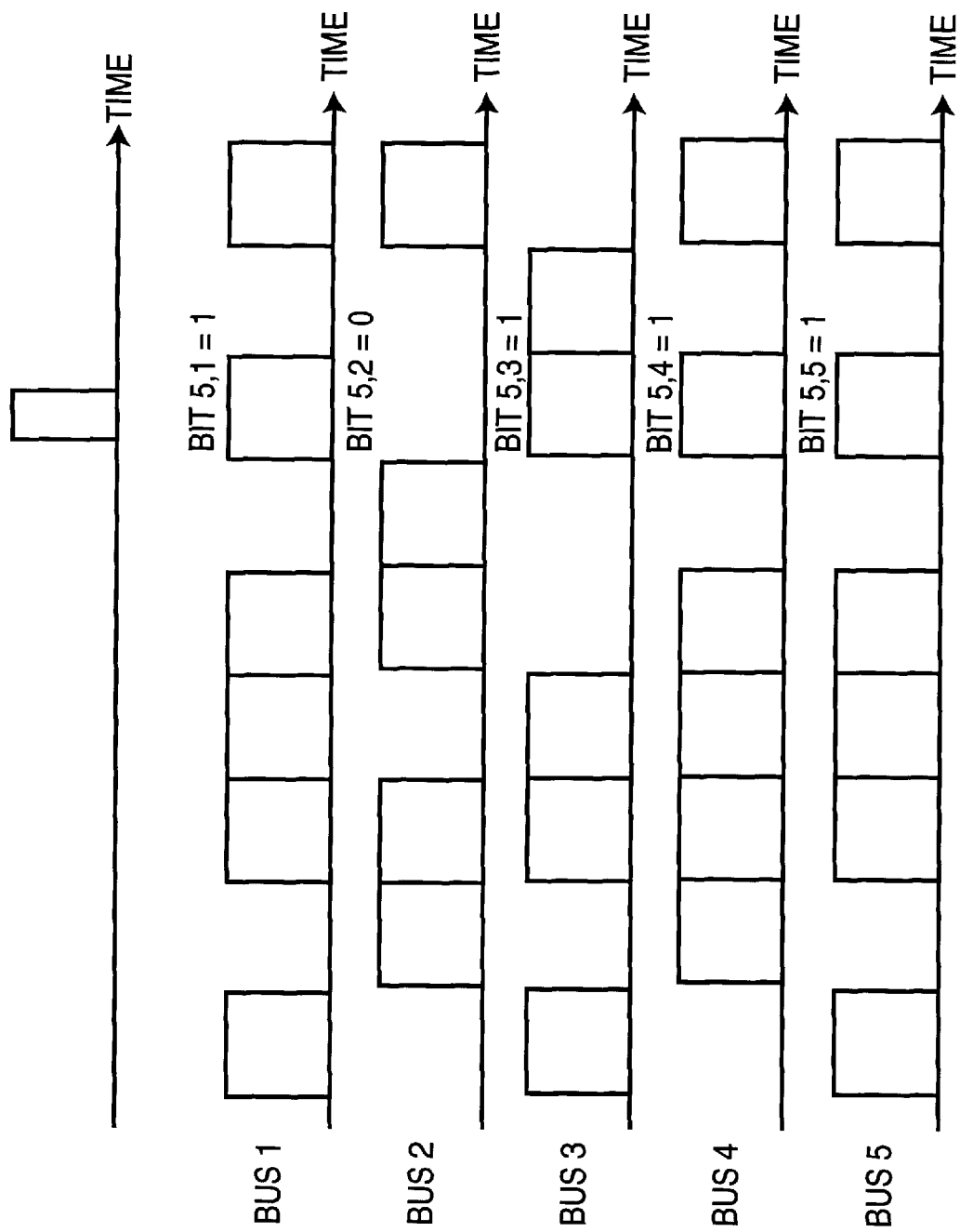
FIG. 9 is a timing diagram useful in understanding an alternative addressing arrangement useful with the embodiment of FIG. 8.

FIG. 9 is a timing diagram useful in understanding the addressing arrangement of the preceding paragraph which is useful with the fiber embodiment of FIGS. 7 and 8. In this arrangement, the drive levels for the individual pixels are encoded as a sequence of 5-bit digital signal words on data bus 222S, 224S, represented by the signals designated Bus 1, Bus 2, . . . Bus 5 at any given time. The pulse being clocked along the shift register of scanner circuit 232, 234 is represented by the pulse shown in the top trace of FIG. 9. Using the common convention that a high level represents a logical "1" and a low level represents a logical "0", the 5-bit digital word has the magnitude "10111" in the time slot or position associated with the select scanner pulse, and will have the magnitude "00100" during the next time slot in sequence when the select scanner pulse will have propagated one time slot to the right in FIG. 9. Since only one pixel is selected by the select scanner pulse at any given time, the drive signal level for that pixel can be on data bus 222S, 224S over the entire length of fiber 200 at that time. An analog ramp signal applied to one conductor of conductor 222, 224 of fiber 200 is applied in common to all the detectors 280 and is compared to the analog value of the 5-bit drive level data word stored therein. At each pixel 250, the light-emitting material 230 is activated (turned "on") by driver circuit 284 whenever the magnitude of the analog ramp signal is less than the magnitude of the analog value of the 5-bit drive level data word stored therein, and the light-emitting material 230 is deactivated (turned "off") by driver circuit 284 whenever the magnitude of the analog ramp signal exceeds the magnitude of the analog value of the 5-bit drive level data word stored therein. Thus, control of the brightness or intensity of the light emitted by each pixel (the "grey scale" of the displayed image) is accomplished by controlling the proportion of the time, i.e. of each period of the analog ramp signal, that each pixel is activated, which can be any proportion between 0% and 100%.

Electronic elements of this arrangement, i.e., scanner circuit 232, 234 and detectors 280, may be produced by either fabricating the electronic circuits first by forming poly-silicon transistors (p-Si TFTs), at high temperature, and then processing the electro-luminescent EL materials at a lower temperature, or to process the EL materials first, and then fabricate amorphous silicon transistor (α-Si TFI) -based electronic circuits using a low temperature TFT process. For example:

| Sequence | First Process | Second Process |
| --- | --- | --- |
| #1A | Poly-silicon TFT @ 650° C. | Inorganic EL material @ 500° C. |
| #1B | Inorganic EL @ 500° C. | Amorphous Silicon TFT @ 400° C. |

For organic electroluminescent materials, the p-Si TFT or α-Si TFT is processed first and the OLED material is then processed at a lower temperature. A further alternative is to employ organic TFTs that can be processed contemporaneously with the OLED materials.

| Sequence | First Process | Second Process |
| --- | --- | --- |
| #2A | Amorphous Silicon TFT @ 400° C. | Organic EL material (OLED) @ 100° C. |
| #2B | Poly-silicon TFT @ 650° C. | Organic EL material (OLED) @ 100° C. |
| #2C | Organic TFT @ 100° C. | Organic EL material (OLED) @ 100° C. |

In the organic EL embodiment, for example, conductors 222, 224 also conduct an AC drive voltage, such as up to an about 100 volt peak, 10 kilohertz excitation signal, that is applied by drive circuitry 284 to the EL material 230 to activate particular pixels 250. Known poly-silicon TFTs fabricated on a silicon substrate using about 1 $\mu$m design rules and driving small EL pixels (e.g., about 12 $\mu$m square) can operate with a 10 kHz drive voltage of 60 volts peak. For larger 1000 $\mu$m pixels that require only about 10 TFT devices per pixel, i.e. for providing the scanner circuit 232, 234 and the detector 280, the TFT devices are larger and can operate with higher drive voltages. These scanner circuits 232, 234 can drive a standard stack of organic EL material that has two insulators of 2500 Å thickness for a total insulator thickness of 5000 Å, and a thickness of 7000 Å of Zn:Mn EL material thickness, which typically has a threshold voltage of about 175–180 volts peak and is operated at about 40 volts above the threshold voltage, or at about 220 volts peak. By way of further example, a "thinned inorganic EL stack" including a standard $ZnSO_4$:Mn yellow phosphor has the following light output and contrast ratio characteristics when operated with a 10 kHz excitation signal at a 60 Hz frame rate and a 70% duty cycle (ratio of "on" time to "off" time):

| Thickness of EL Layer | AC Peak Voltage @ 10 kHz | Luminance, Foot-Lamberts | Contrast Ratio |
| --- | --- | --- | --- |
| 700 Å | 48 volts | 75 | 300:1 |
| 1750 Å | 67 volts | 150 | 500:1 |
| 3500 Å | 100 volts | 300 | 1000:1 |

In addition, because presently available polymer OLED materials exhibit a lifetime of about 15,000 hours in a moisture-free environment, it may be desired to obtain comparable lifetime of the OLED material when moisture will be present. Thus, it may become desirable to coat the OLED layer 130 of light-emitting fiber 100 (i.e. the exposed portions of OLED layer 130 not covered by contact 140) with a moisture-resistant passivation coating, such as a silicon nitride, diamond-like carbon, phosphorus-silicate glass or other suitable coating, to preclude, or at least reduce, moisture infiltration. The passivation material is preferably deposited after, but may be deposited before, contacts 140 and metal conductors 160, 162 are formed.

Among the advantages of the arrangements described herein are the ability to provide large-area, high-brightness, high-resolution, full-color displays using a low-cost, modular approach that avoids the expense and waste of conventional large-area displays. Displays according to the present invention do not require tiling of display segments, and so are optically seamless and tend to provide improved display brightness uniformity, even though the electrical operation of the display or the supporting electronic circuits may be modular. Displays greater than 150 cm by 150 cm (about 60 inches by 60 inches), and 250 cm by 250 cm (about 100 inches by 100 inches), for example, displays having a diagonal greater than 3.6–3.7 m (about 12 feet), are practical, as are displays having a format of 1000 pixels by 1000 pixels, or more. Display panels of 150–250 cm on a side may conveniently be arranged in side-by-side array to form even larger displays, such as for teleconferencing screens, billboards and/or scoreboard displays. Nonetheless, the arrangement is also advantageous for smaller displays, e.g., a 75 cm by 100 cm (about 30 by 40 inches) employing about 1000 fibers each about 75 mm (about 30 inches) long. If, however, smaller displays and/or higher resolution displays are desired, such could be made in accordance with the present invention.

Moreover, displays 10 including the present invention may be flat, curved or otherwise non-planar, and may be rigid or flexible. Flexibility obtains as a result of the flexibility of the thin light-emitting fibers 100 and the flexible circuit boards that may be employed for substrate 20, and even if the flexibility of the light-emitting fibers is limited, the display will be flexible about an axis parallel to the direction in which the light-emitting fibers 100 lay. Such flexibility, even if not utilized to flex a display, tends to make the display less susceptible to breakage. Further, since the display is formed of a substantial number of independent light-emitting elements along many independent light-emitting fibers, and employs many separate electrical circuit boards and electrical drive circuits, it tends to be lightweight and quite robust, and is likely to remain useful under severe field conditions, including, for example, shock, vibration and/or puncture by a projectile, that cause failure of individual pixels or fibers, or of groups of pixels or fibers.

While the present invention has been described in terms of the foregoing exemplary embodiments, variations within the scope and spirit of the present invention as defined by the claims following will be apparent to those skilled in the art. For example, while OLED materials are preferred, other light-emitting materials, such as inorganic electroluminescent (EL) materials or field emission devices (FEDs) could be utilized. Further, similar linearly-addressed displays could employ light-emitting elements that are continuously energized to produce light, with the light output thereof passing to the viewing surface controlled by a light valve device, such as a liquid crystal device (LCD), responsive to a linearly-addressed detector/decoder. In addition, electrical conductors along the light-emitting fiber 200 may be a serial or parallel digital data bus or other multi-conductor arrangement, or may be a microwave strip line.

While display 10 is described as having driver circuits 40 mounted on substrate 20 and input circuits 170 mounted on fibers 100, the functions thereof may be combined in a single device that is mounted on substrate 20 or on fibers 100, as is convenient. Alternative circuitry substrates, such as conventional printed wiring circuit boards, both rigid and flexible, as well as thick-film circuits on glass, plastic, ceramic or ceramic-on-metal substrates, may also be employed.

What is claimed is:

1. A light-emitting fiber comprising:
   an elongated fiber substrate;
   at least one electrical conductor disposed along said fiber substrate for conducting an electrical signal along said fiber substrate;
   a plurality of light-emitting elements disposed along a surface of said fiber substrate, each said light-emitting element having first and second electrodes between which the electrical signal is applied to cause said light-emitting element to emit light;
   means operably associated with said fiber substrate for propagating an information-representative signal along said fiber substrate; and
   a plurality of detectors disposed along said fiber substrate and each operably associated with one of said plurality of light-emitting elements for selectively applying the electrical signal thereto in response to the information-representative signal propagating along said fiber substrate.

2. The light-emitting fiber of claim 1 wherein said means for propagating includes source of at least one of light, frequency-modulated light, a digital electrical signal, an analog electrical signal and a pulse-width modulated electrical signal containing said information-representative signal.

3. The light-emitting fiber of claim 1 wherein each of said plurality of detectors includes a decoder decoding information from said information-representative signal and applying the electrical signal responsive to the decoded information.

4. The light-emitting fiber of claim 1 wherein said fiber substrate includes a transparent fiber, and wherein said means for propagating includes a source of light propagating in said transparent fiber and containing said information-representative signal.

5. The light-emitting fiber of claim 4 wherein said information-representative signal is frequency modulated on said light.

6. The light-emitting fiber of claim 5 wherein each of said plurality of detectors includes a light-responsive detector tuned to a frequency of said frequency modulated light.

7. The light-emitting fiber of claim 4 wherein the first electrodes of said plurality of light-emitting elements include a layer of an optically-transparent electrically conductive material.

8. The light-emitting fiber of claim 7 wherein the optically-transmissive electrically conductive material is selected from the group consisting of indium tin oxide, tin oxide, zinc oxide, and combinations thereof.

9. The light-emitting fiber of claim 7 wherein said at least one electrical conductor is disposed along said fiber substrate contiguous to said layer of optically-transmissive electrically conductive material and is electrically coupled thereto.

10. The light-emitting fiber of claim 9 wherein said at least one electrical conductor is selectively coupled to said layer of optically-transmissive electrically conductive material by said plurality of detectors.

11. The light-emitting fiber of claim 4 wherein each of said plurality of detectors is responsive to said light propagating in said transparent fiber for selectively applying the electrical signal to one of the first and second electrodes of the one light-emitting element with which said detector is operably associated.

12. The light-emitting fiber of claim 1 wherein said fiber substrate further includes a plurality of electrical conductors thereon, and wherein said means for propagating includes a source of electrical information-representative signal conducted by said plurality of electrical conductors.

13. The light-emitting fiber of claim 12 wherein said electrical information-representative signal contains address information corresponding to ones of said plurality of light-emitting elements, and wherein each of said plurality of detectors includes an electrical detector responsive to the address information for the one of said plurality of light-emitting elements with which it is operably associated.

14. The light-emitting fiber of claim 13 wherein said address information is digitally encoded, and wherein each of said plurality of detectors includes a digital decoder for decoding the address information.

15. The light-emitting fiber of claim 13 wherein each of said plurality of detectors includes at least one stage of a shift register, and wherein said electrical information-representative signal contains a shift register clocking signal for clocking said stages of said shift register and value information corresponding to values associated with ones of said plurality of said plurality of light-emitting elements.

16. The light-emitting fiber of claim 15 wherein the values of the value information represents at least one of the magnitude, timing and duration of the electrical signal applied to said plurality of light-emitting elements.

17. The light-emitting fiber of claim 15 wherein the value information is digital data, and wherein each of said plurality of detectors stores said digital data responsive to said shift register.

18. The light-emitting fiber of claim 1 in combination with a plurality of like light-emitting fibers in side-by-side physical relationship to provide a display of information by the light-emitting elements thereon.

19. Light-emitting apparatus comprising:
   an elongated substrate having a length;
   at least one electrical conductor disposed along the length said elongated substrate for conducting an electrical signal along the length of said elongated substrate;
   a plurality of light-emitting elements disposed along the length of and on one surface of said elongated substrate, each said light-emitting element having first and second electrodes and a light-emissive material therebetween, wherein the electrical signal is selectively applied between the first and second electrodes of each light-emitting element to cause said light-emitting element to emit light;

a source of an information-representative signal operably associated with said elongated substrate for propagating the information-representative signal along the length of said elongated substrate; and a plurality of detectors disposed along the length of said elongated substrate and each operably associated with one of said plurality of light-emitting elements for selectively applying the electrical signal thereto in response to the information-representative signal propagating along said elongated substrate.

20. The light-emitting apparatus of claim 19 wherein said elongated substrate is transparent, and wherein said source of an information-representative signal includes a source of light propagating in said transparent elongated substrate, said light containing said information-representative signal.

21. The light-emitting apparatus of claim 19 wherein said fiber substrate further includes a plurality of electrical conductors thereon, and wherein said means for propagating includes a source of electrical information-representative signal conducted by said plurality of electrical conductors.

22. A display for displaying information comprising:

a plurality of fibers disposed in side-by-side arrangement to define a viewing surface of the display;

at least one electrical conductor disposed along each of said plurality of fibers for conducting an electrical signal along each of said fibers;

a plurality of light-emitting elements disposed along a surface of each of said plurality of fibers, each said light-emitting element having first and second electrodes between which the electrical signal is applied to cause said light-emitting element to emit light;

means operably associated with each of said plurality of fibers for propagating an information-representative signal along each said fiber; and a plurality of detectors disposed along each of said fibers and each operably associated with one of said plurality of light-emitting elements for selectively applying the electrical signal thereto in response to the information-representative signal propagating along said fiber, thereby causing ones of said light-emitting elements to emit light to display the information.

23. The display of claim 22 wherein said means for propagating includes a source of at least one of light, frequency-modulated light, a digital electrical signal, an analog electrical signal and a pulse-width modulated electrical signal containing said information-representative signal.

24. The display of claim 22 wherein each of said plurality of detectors includes a decoder decoding information from said information-representative signal and applying the electrical signal responsive to the decoded information.

25. The display of claim 22 further comprising a substrate on which said plurality of fibers are disposed in the side-by-side arrangement.

26. The display of claim 25 wherein said substrate is transparent and wherein the viewing surface defined by said plurality of fibers is viewed through said substrate.

* * * * *